United States Patent [19]

Berg

[11] Patent Number: 4,658,330

[45] Date of Patent: * Apr. 14, 1987

[54] MOUNTING A HYBRID CIRCUIT TO A CIRCUIT BOARD

[75] Inventor: William E. Berg, Portland, Oreg.

[73] Assignee: Tektronix, Inc., Beaverton, Oreg.

[*] Notice: The portion of the term of this patent subsequent to Apr. 14, 2004 has been disclaimed.

[21] Appl. No.: 773,756

[22] Filed: Sep. 9, 1985

[51] Int. Cl.⁴ .......................... H05K 1/12; H05K 7/20
[52] U.S. Cl. .................... 361/386; 361/398; 361/403; 339/17 CF
[58] Field of Search ............. 357/79, 81; 174/52 FP; 339/17 F, 17 CF, 17 LM, 61 M, 176 MP, 112 R; 361/386–388, 398, 400, 401, 403, 413

[56] References Cited

U.S. PATENT DOCUMENTS

| | | | |
|---|---|---|---|
| 4,042,861 | 8/1977 | Yasuda | 361/398 |
| 4,251,852 | 2/1981 | Ecker | 361/398 |
| 4,255,003 | 3/1981 | Berg | 339/61 M |
| 4,517,624 | 5/1985 | Wesselly | 361/398 |

Primary Examiner—G. P. Tolin
Attorney, Agent, or Firm—John Smith-Hill

[57] ABSTRACT

A unitary electronic circuit element has an interconnect surface at which it is provided with contact pads and is mounted on a circuit board using a flexible, sheet-form interconnect member that comprises dielectric material and runs of electrically conductive material. Each conductor run extends between a contact pad that is exposed at a first main face of the interconnect member and a termination point that is exposed at a second main face of the interconnect member. The interconnect surface of the electronic circuit element and the second main face of the interconnect member are placed in mutually confronting relationship, and the circuit element is attached to the second main face of the interconnect member by way of its interconnect surface, whereby electrically conductive contact is established between the contact pads of the circuit element and the corresponding termination points of the interconnect member. The circuit element is attached by way of its back face to a thermally conductive plate that has, at one main face, pressure pads that at least partially surround a circuit element receiving area of the plate. The first main face of the interconnect member and the main face of the circuit board are placed in mutually confronting relationship, with the contact pads of the interconnect member touching corresponding contact pads of the circuit board. The plate and the circuit board are clamped together, whereby the pressure pads supply contact force to maintain the contact pads of the interconnect member in electrically conductive pressure contact with the corresponding contact pads of the circuit board.

12 Claims, 13 Drawing Figures

MOUNTING A HYBRID CIRCUIT TO A CIRCUIT BOARD

This invention relates to a method of mounting a hybrid circuit to a circuit board.

BACKGROUND OF THE INVENTION

Numerous techniques exist for mounting an integrated circuit chip to a ceramic substrate. These methods have in common the fact that they are directed to providing a reliable interconnection between conductor runs on the ceramic substrate and contact pads on the integrated circuit chip itself. Under some circumstances, the assembly of the chip and the substrate is mounted in a package, and leads extend from the package for connecting the chip to other components. Typically, the leads may enable the package to be plugged into a mating socket that is mounted on an etched circuit board (ECB). Under other circumstances, it may be desired to mount the substrate directly to an ECB. When the signals that pass between the conductor runs of the ECB and the conductor runs of the substrate are at low frequencies, it is not necessary to pay a great deal of attention to the electrical characteristic of the interconnections between the substrate and the circuit board, but as signal frequency increases the demands that are placed on the interconnections in order to avoid degradation of the signal become more severe. One electrical connector that is able to transmit high frequency signals without undue degradation is described in U.S. Pat. No. 4,255,003 issued Mar. 10, 1981. In the case of that connector, the substrate is fitted in a recess in the circuit board, and the conductor runs on the substrate extend to the periphery of the substrate and align at the periphery with corresponding conductor runs on the upper surface of the board. A frame-like pressure pad of elastomer, having conductive fingers on its lower surface, is fitted so that it bridges the gap between the ceramic substrate and the circuit board, and the conductive fingers establish electrical connection between the conductor runs of the substrate and the corresponding conductor runs of the circuit board. A frame member is fitted over the pressure pad and is secured to the board, compressing the elastomer so that contact force is provided for maintaining the conductive fingers in contact with the conductor runs. This type of connector has been used successfully with signals at frequencies of up to 10 GHz.

SUMMARY OF THE INVENTION

In a preferred embodiment of the invention, a unitary electronic circuit element that has an interconnect surface at which it is provided with contact pads is mounted on a circuit board using a flexible, sheet-form interconnect member that comprises dielectric material and runs of electrically conductive material supported by the dielectric material in mutually electrically insulated relationship. Each conductor run extends between a contact pad that is exposed at a first main face of the interconnect member and a termination point that is exposed at a second main face of the interconnect member. The contact pads of the interconnect member correspond in their layout to that of the contact pads of the circuit board, and the termination points correspond in their layout to that of the contact pads of the electronic circuit element. The interconnect surface of the electronic circuit element and the second main face of the interconnect member are placed in mutually confronting relationship, and the circuit element is attached to the second main face of the interconnect member by way of its interconnect surface, whereby electrically conductive contact is established between the contact pads of the circuit element and the corresponding termination points of the interconnect member. The circuit element is attached by way of its back face to a thermally conductive plate that has, at one main face, pressure pads that at least partially surround a circuit element receiving area of the plate. The first main face of the interconnect member and the main face of the circuit board are placed in mutually confronting relationship, with the contact pads of the interconnect member touching the corresponding contact pads of the circuit board. The plate and the circuit board are clamped together, whereby the pressure pads supply contact force to maintain the contact pads of the interconnect member in electrically conductive pressure contact with the corresponding contact pads of the circuit board.

BRIEF DESCRIPTION OF THE DRAWINGS

For a better understanding of the invention and to show how the same may be carried into effect, reference will now be made, by way of example, to the accompanying drawings in which.

DETAILED DESCRIPTION

Figure 1:
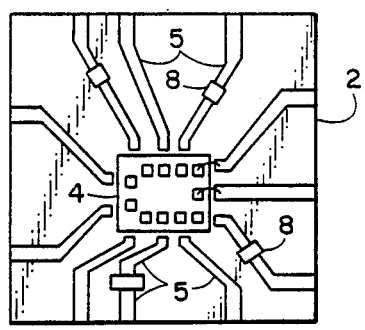
FIG. 1 is a top plan view of a hybrid circuit.
Figure 2:
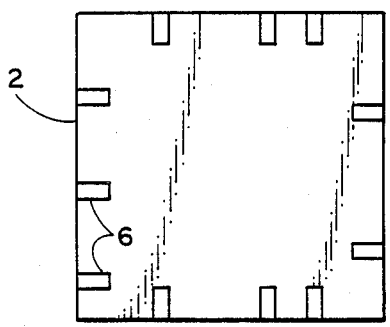
FIG. 2 is a bottom plan view of the hybrid circuit.

The hybrid circuit shown in FIGS. 1 and 2 (which may also be a ceramic chip carrier) comprises a ceramic substrate 2 upon which is mounted a monolithic integrated circuit chip 4. Conductor runs 5 are formed on the substrate 2 are by conventional film technology. Each conductor run extends from an inner end, just outside the footprint of the chip 4, to the periphery of the substrate 2, and is wrapped around the substrate 2 and forms a contact pad 6, at the underside of the substrate. At its inner end, the conductor run 5 is connected by wire bonding to a contact pad on the interconnect face of the chip 4. Several of the conductor runs include discrete elements, such as resistors or capacitors. However, the nature of these discrete circuit elements 8, and the particular nature of the chip 4, are not relevant to the present invention.

Figure 3:
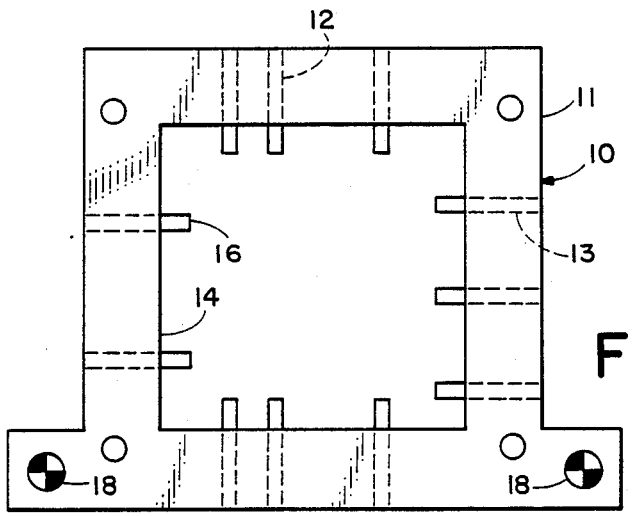
FIG. 3 is a top plan view of a flex circuit.

The flex circuit 10 shown in FIG. 3 is of conventional, three-layer, structure, comprises an upper layer 11 of dielectric material such as polyimide, an intermediate layer of adhesive (not shown) and a lower, patterned layer of conductive material. The conductive material is patterned to form conductor runs 12, each of which extends from a pad region 13 at an outer edge of the flex circuit to a window 14, and projects into the window as a beam 16. The window 14 is sized to receive the substrate 2, and the beams 16 are positioned to be contacted by the pads 6 when the substrate is inserted, bottom face first, into the window in the correct orientation. When the substrate is fitted in the window 16, the pads 6 and the beams 16 are bonded together by reflow solder.

During manufacture of the flex circuit, alignment targets 18 are formed at the same time as the conductor runs 12 are defined, and therefore the targets 18 are positioned accurately relative to the conductor runs 12.

Figure 4:
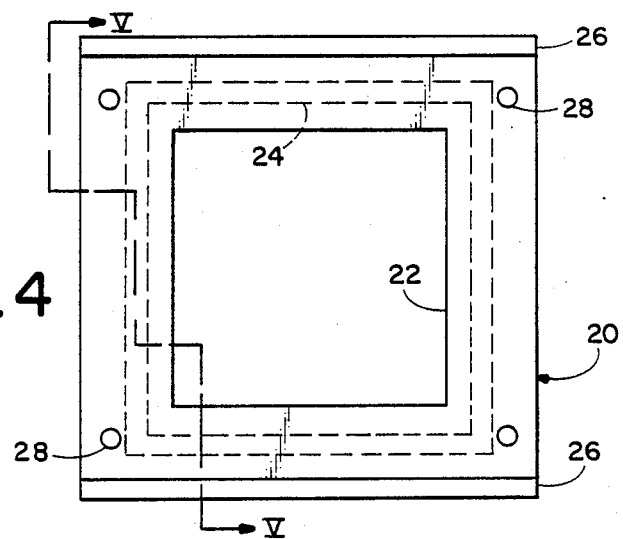
FIG. 4 is a top plan view of a metal plate.
Figure 5:
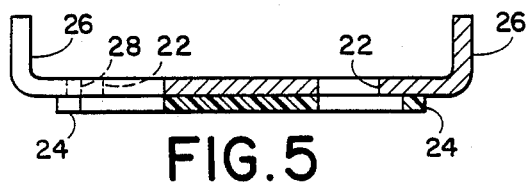
FIG. 5 is a sectional view taken on the line V—V of FIG. 4.

The plate 20 that is shown in FIGS. 4 and 5 also defines a window 22. However, the window 22 is somewhat smaller than the substrate 2. The plate 20 carries at its underside a frame-like ridge 24 of an elastomer, such as silicone rubber, that is transfer molded to the plate 20. The elastomer is a commercially available product having a compression set of 5% or less over the temperature range from about 10 degrees C to about 150 degrees C. The ridge 24 surrounds the window 22. At its upper side, wings 26 of the plate are bent upwardly, to provide for transfer of heat from the plate 20 to the ambient air. The wings also increase the rigidity of the plate, and aid in manipulation. The plate is formed with holes 28.

After the substrate 2 has been bonded to the flex circuit 10, the plate 20 is bonded to the subassembly of the substrate 2 and the flex circuit 10. In order to do this, the plate 20 is fitted over the substrate 2 and the underside of the plate is attached to the periphery of the substrate by means of a thermally conductive RTV (room temperature vulcanizable) adhesive, such as Dow Corning Silgard.

Figure 6:
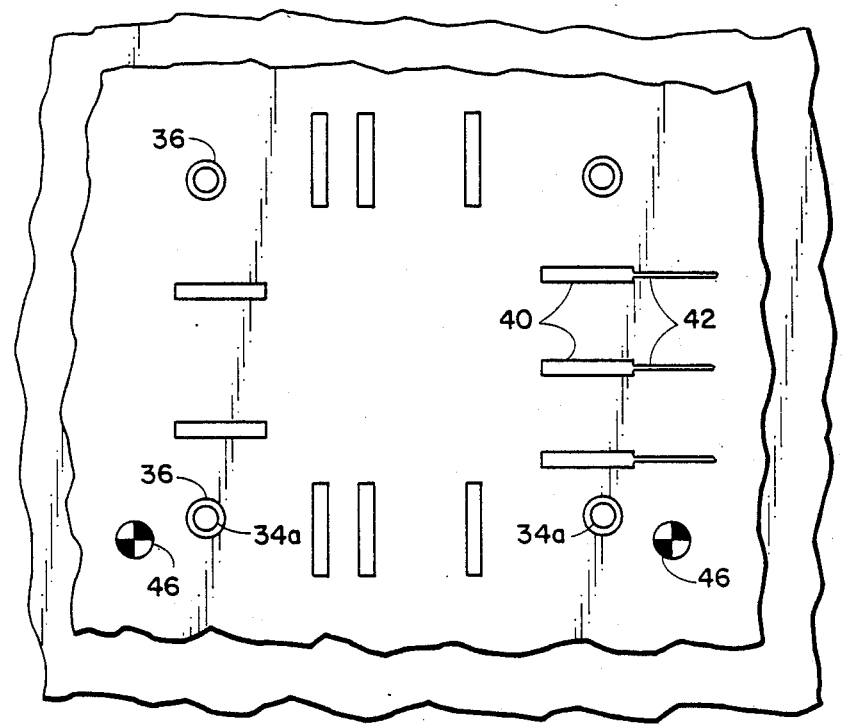
FIG. 6 is a plan view, to a reduced scale, of a circuit board.
Figure 7:
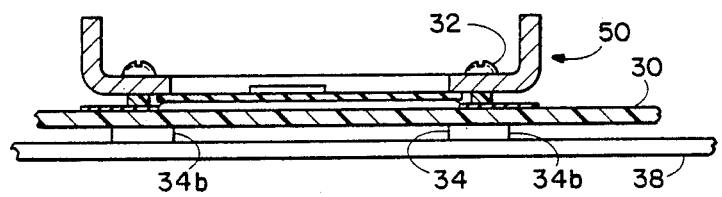
FIG. 7 is a side view, partly in section, of the circuit board with the hybrid circuit, flex circuit and metal plate mounted thereto.

The assembly of the hybrid circuit, the flex circuit and the plate 20 is attached to a circuit board 30 (FIGS. 6 and 7). Screws 32 pass through the holes 28 in the plate 20 and corresponding holes in the flex circuit 10, and engage threaded apertures formed in bushings 34 that extend through openings 36 in the circuit board 30 from a heat sink member 38. Each of the bushings 34 has a narrow, upper portion 34a and a thicker, lower portion 34b. The upper portion 34a extends with clearance into the appropriate aperture 36 in the circuit board 30, and the shoulder defined between the upper and lower portions 34a and 34b engages the back surface of the circuit board. The lower portion 34b of the bushing serves to maintain clearance between the heat sink member 38 and the circuit board 30 while the upper portion 34a, engaging the underside of the plate 20, prevents overcompression of the ridge 24. The circuit board is provided at its upper surface with contact pads 40 which are connected to conductor runs 42. The layout of the contact pads 40 of the upper main face of the circuit board corresponds to the layout of the conductor runs 12 of the flex circuit. During the operation in which the contact pads 40 are defined on the upper main face of the circuit board, alignment targets 46 are also formed on the upper main face of the circuit board. Thus, the targets 46 are positioned accurately relative to the contact pads 40, which are positioned accurately relative to one another.

When the screws 32 have been fitted in the bushings 34, and before the screws are tightened, the assembly 50 of the hybrid circuit 2, the flex circuit 10 and the aluminum plate 20 is adjusted relative to the circuit board, within the limits permitted by the clearance between the bushing portions 34a and the circuit board, to establish registration between the targets 18 and the targets 46. The positioning of the targets 18 relative to the pad regions 13 of the conductor runs 12 is nominally the same as that of the targets 46 relative to the contact pads 40, and therefore the pad regions 13 of the flex circuit are then in registration with the contact pads 40 of the circuit board. The screws are then tightened, securing the assembly 50 relative to the circuit board 30, and the flex circuit 10 is clamped between the ridge 24 and the circuit board. Compression of the ridge 24 supplies contact force to maintain the conductor runs 12 in electrically conductive pressure contact with the pads 40.

Figure 8:
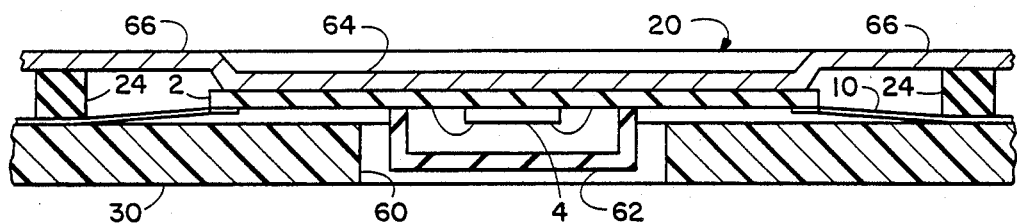
FIG. 8 is a partial view, similar to FIG. 7, of a modified form of the arrangement shown in FIG. 7.

In a modification that is shown in FIG. 8, the thermal resistance between the chip 4 and the plate 20 is reduced by eliminating the window in the plate 20 and securing the substrate 2 to the plate 20 by way of its back face. In order to keep the flex circuit 10 as flat as possible, the interconnection surface of the substrate 2 is on the same side of the substrate as the chip 4 and an opening 60 is formed in the circuit board to receive the chip 4 and its lid 62. The central area 64 of the plate 20 is depressed relative to the edge regions 66 at which the ridge 24 is provided, in order to place the interconnect surface of the substrate 2 close to the circuit board without reducing the height of the ridge 24. It is necessary to maintain the height of the ridge in order to accommodate the desired degree of compression of the elastomer.

Figure 9:
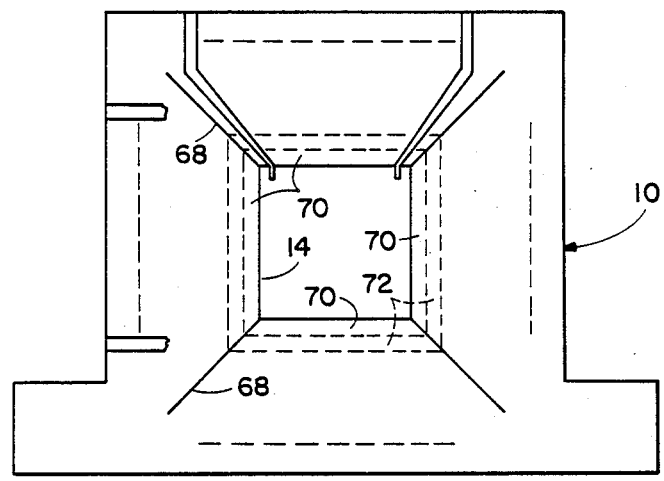
FIG. 9 is a top plan view of a second flex circuit.
Figure 10:
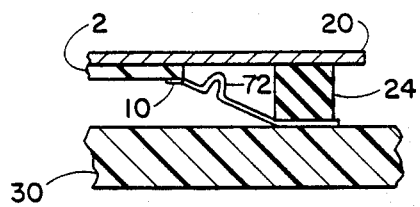
FIG. 10 is a partial side view, partly in section, of an arrangement of a circuit board, hybrid circuit, flex circuit and metal plate, the flex circuit being in accordance with FIG. 9.

Fabricating a circuit board with an opening to receive the chip 4 may not be desired, and this may be avoided, while still obtaining the advantage of the FIG. 8 arrangement, by using the FIGS. 9 and 10 arrangement. As shown in FIG. 9, the flex circuit 10 is formed with slits 68 extending from the corners of the window 14 so that four independently movable wings 70 are formed. Each of the wings is then creased at 72, in opposite directions along two parallel lines, and the flex circuit is soldered to the substrate. The sides of the crease 72 will close together as the elastomer ridge 24 is compressed by tightening of the screws 32, allowing the substrate to be brought closer to the circuit board without stressing the solder joints between the flex circuit and the substrate.

A further modification of the arrangement described with reference to FIGS. 1 to 7 will now be described with reference to FIGS. 11 to 13.

Figure 11:
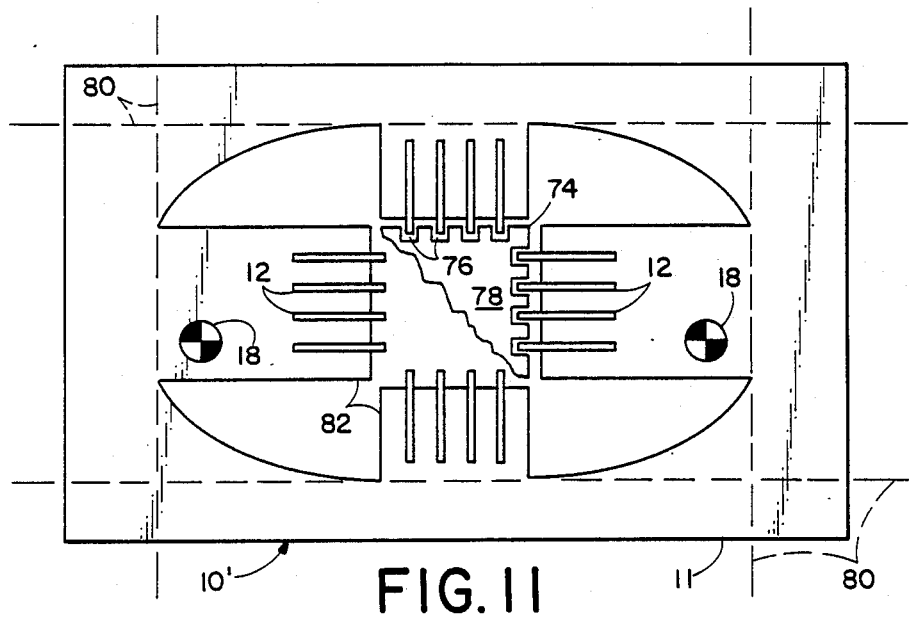
FIG. 11 is a top plan view of a flex circuit having a leadless chip carrier attached thereto.
Figure 12:
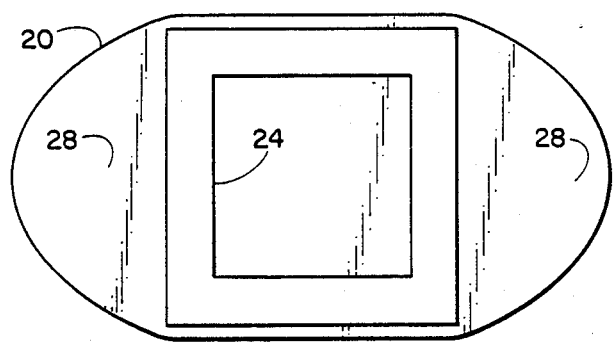
FIG. 12 is a bottom plan view of a metal plate used for securing the FIG. 11 flex circuit to a circuit board.
Figure 13:
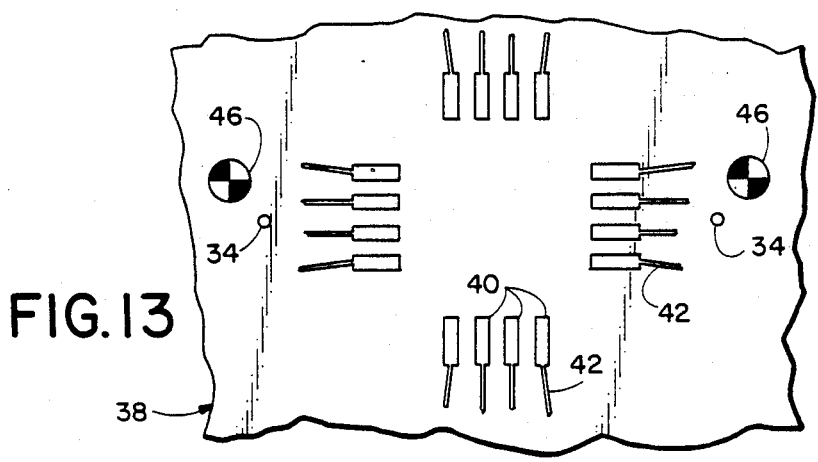
FIG. 13 is a top plan view of the circuit board to which the FIG. 11 flex circuit is attached using the metal plate of FIG. 12.

In the case of FIGS. 11 to 13, the IC chip (not shown) is mounted in conventional manner in a standard leadless chip carrier 74 having terminals 76 distributed about the perimeter of its interconnect face 78. A composite sheet comprising a layer of polyimide having a layer of copper laminated thereto is patterned and selectively etched to produce the flex circuit 10'. The flex circuit comprises conductor runs 12 of copper supported by the remaining polyimide material 11, as well as alignment targets 18 that are defined in the layer of copper at the same time as the conductor runs 12 and are therefore accurately positioned with respect thereto. The terminals of the chip carrier are soldered to the inboard ends of the conductor runs 12, and the flex circuit is cropped along the lines 80, leaving the separate wings 82 of the flex circuit attached to the chip carrier. An aluminum plate 20 has a frame-like ridge 24 of elastomer transfer molded thereto, and the chip carrier is fitted into the opening bounded by the ridge 24 and the back face of the chip carrier is attached to the plate 20 by means of a thermally conductive RTV adhesive. In this position, the wings 82 of the flex circuit extend across the four sides respectively of the ridge 24. The plate 20 is formed with screw holes 28 through which screws pass with a small amount of clearance. The assembly of the chip carrier, the wings 82 and the aluminum plate 20 is inverted and its lower face is presented towards the upper face of the circuit board 30. The circuit board includes conductor runs 42 that terminate in contact pads 40, and is provided with alignment targets 46 that are formed at the same time as the contact pads 40 and are accurately positioned with respect thereto. The targets 18 of the flex circuit are aligned with the targets 46 of the circuit board, and the conductor runs 18 of the flex circuit are then in registration with the contact pads 40 of the circuit board. The screws are inserted through the holes 28 and engage nuts 34' that are swaged into holes in the circuit board. The screws are tightened and contact force provided by the ridge 24 holds the conductor runs 18 in firm pressure contact with the contact pads 40.

It will be appreciated that the invention is not restricted to the particular embodiments that has been described with reference to the drawings, and that variations may be made therein without departing from the scope of the invention as defined in the appended claims, and equivalents thereof. In particular, it is not essential to use a visual method of establishing alignment between the interconnect member and the circuit board and, for example, a mechanical method using pins mounted on the circuit board and holes in the interconnect member, may also be used.

I claim:

1. In combination:
   a unitary electronic circuit element that has a plurality of contact pads at its interconnect surface,
   a circuit board that comprises dielectric material, runs of conductive material supported by the dielectric material in mutually electrically insulated relationship, and mutually spaced pads of conductive material connected to said runs and exposed at one main face of the circuit board,
   at least one flexible, sheet-form interconnect member that comprises dielectric material and runs of conductive material supported by the dielectric material in mutually electrically insulated relationship, each run extending between a contact pad that is exposed at one main face of the interconnect member and a termination point that is exposed at the opposite main face of the interconnect member, the termination points being in electrically conductive contact with respective contact pads of the circuit element, and the contact pads of the interconnect member corresponding in their layout to that of the contact pads of the circuit board,
   a thermally conductive plate that has, at one main face, pressure pad means at least partially surrounding a circuit element receiving area, the circuit element being secured by way of its face opposite its interconnect surface to the circuit element receiving area of the thermally conductive plate, and
   means securing the plate and the circuit board together with said one main face of the interconnect member in confronting relationship with said one main face of the circuit board and the contact pads of the interconnect member in registration with the corresponding contact pads respectively of the circuit board, said pressure pad means being compressed and supplying contact force to maintain the contact pads of the interconnect member in electrically conductive pressure contact with the contact pads of the circuit board.

2. A combination according to claim 1, wherein the circuit element comprises a substrate of dielectric material having first and second main faces, said interconnect surface being at least part of said first main face, and wherein the circuit element includes at least one monolithic integrated circuit chip secured to the second main face of the substrate and the thermally conductive plate defines an opening into which said chip extends.

3. A combination according to claim 1, wherein the circuit element comprises a substrate of dielectric material having first and second main faces, and at least one monolithic integrated circuit chip secured to the first main face of the substrate, and wherein the interconnect surface of the circuit element is a peripheral portion of said first main face and the circuit board defines an opening into which said chip extends.

4. A combination according to claim 1, comprising a plurality of interconnect members having their termination points in electrically conductive contact with respective groups of contact pads of the circuit element and having their contact pads in contact with respective groups of contact pads of the circuit board.

5. A combination according to claim 2, wherein the interconnect member and the circuit board carry respective alignment indicia that are in optical registration.

6. A method of mounting a unitary electronic circuit element that has an interconnect surface at which it is provided with contact pads, to a circuit board that comprises dielectric material, runs of electrically conductive material supported by the dielectric material in mutually electrically insulated relationship, and mutually spaced pads of conductive material connected to said runs and exposed at one main face of the board, said method comprising:
   providing a flexible, sheet-form interconnect member that comprises dielectric material and runs of electrically conductive material supported by the dielectric material in mutually electrically insulated relationship, each run extending between a contact pad that is exposed at one main face of the interconnect member and a termination point that is exposed at the opposite main face of the interconnect member, the contact pads of the interconnect member corresponding in their layout to that of the contact pads of the circuit board and the termination points corresponding in their layout to that of the contact pads of the circuit element,
   placing the interconnect surface of the circuit element and the opposite main face of the interconnect member in mutually confronting relationship,
   attaching the circuit element by way of its interconnect surface to said opposite main face of the interconnect member, whereby electrically conductive contact is established between the contact pads of the circuit element and the corresponding termination points of the interconnect member, providing a thermally conductive mounting plate that has, at one main face, pressure pad means at least partially surrounding a circuit element receiving area, attaching the circuit element by way of it face opposite the interconnect surface to the circuit element receiving area of the plate, placing said one main face of the interconnect member and said one main face of the circuit board in mutually confronting relationship, with the contact pads of the interconnect member touching the corresponding contact pads of the circuit board, and clamping the plate and the circuit board together, whereby the pressure pad means supply contact force to maintain the contact pads of the interconnect member in electrically conductive pressure contact with the corresponding contact pads of the circuit board.

7. A method according to claim 1, wherein both the interconnect member and the circuit board include alignment targets, and the method further comprises positioning the interconnect member relative to the circuit board by use of the alignment targets.

8. A method according to claim 1, comprising cutting the interconnect member to define a plurality of at least partially independently movable portions.

9. A method according to claim 3, wherein the independently movable portions of the interconnect member are elongate wing portions that extend outwardly from a window defined by the interconnect member and are connected together at their outer ends, each wing portion being creased transverse to its longitudinal direction.

10. A method according to claim 3, wherein the portions of the interconnect member are discrete portions thereof, and each such portion comprises at least one run of electrically conductive material.

11. A method according to claim 1, wherein the circuit element comprises a substrate of dielectric material having first and second main faces, said interconnect surface being at least part of said first main face, and wherein the circuit element includes at least one monolithic integrated circuit chip secured to the second main face of the substrate and the thermally conductive plate defines an opening for receiving said chip.

12. A method according to claim 1, wherein the circuit element comprises a substrate of dielectric material having first and second main faces, and at least one monolithic integrated circuit chip secured to the first main face of the substrate, and wherein the interconnect surface of the circuit element is a peripheral portion of said first main face and the circuit board defines an opening for receiving said chip.

* * * * *